Figure 1:
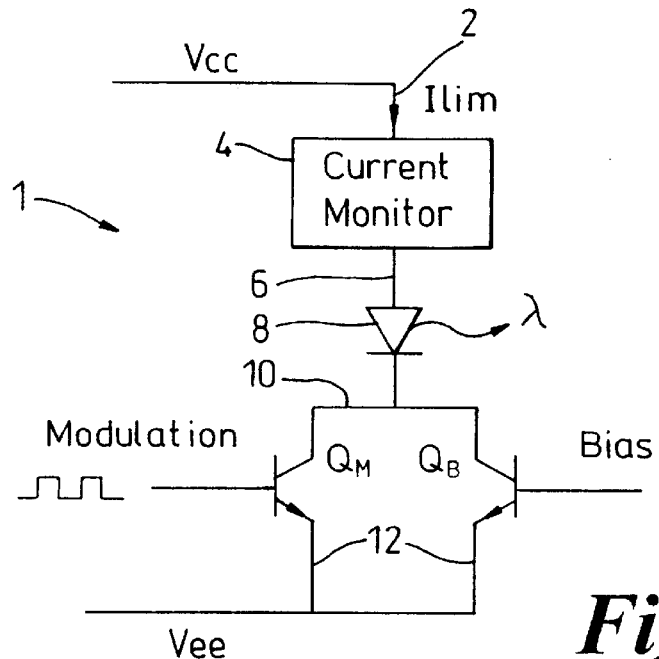

United States Patent
Vaughan et al.

[19]

[11] Patent Number: 6,028,871
[45] Date of Patent: Feb. 22, 2000

[54] DRIVER CIRCUIT FOR A SOLID STATE OPTICAL EMITTER DEVICE

[75] Inventors: John Barry Vaughan; David Philip Martin Chown, both of Ipswich; David Martin Gee, Manningtree, all of United Kingdom

[73] Assignee: Hewlett-Packard Company, Palo Alto, Calif.

[21] Appl. No.: 09/178,312

[22] Filed: Oct. 23, 1998

[30] Foreign Application Priority Data

Dec. 17, 1997 [EP] European Pat. Off. .............. 97310246

[51] Int. Cl.$^7$ ....................................................... H01S 3/00
[52] U.S. Cl. ............................................................... 372/38
[58] Field of Search .................................................. 372/38

[56] References Cited

U.S. PATENT DOCUMENTS

| | | | |
|---|---|---|---|
| 5,315,606 | 5/1994 | Tanaka | 372/38 |
| 5,675,599 | 10/1997 | Abe et al. | 372/38 |
| 5,736,844 | 4/1998 | Yanagisawa | 372/38 |

FOREIGN PATENT DOCUMENTS

| | | |
|---|---|---|
| 0563580A2 | 10/1993 | European Pat. Off. . |
| 0589397A | 3/1994 | European Pat. Off. . |
| 0603899A | 6/1994 | European Pat. Off. . |

OTHER PUBLICATIONS

Patent Abstracts of Japan, vol. 012, No. 063, Feb. 25, 1988, Nagano Katsumi, "Bias Current source for Semiconductor Laser".

Patent Abstracts of Japan, vol. 095, No. 004, May 31, 1995, Kitayama Tadayoshi, "Semiconductor–Laser–Element Driving Circuit".

Patent Abstracts of Japan, vol. 013, No. 248, Jun. 1989, Wada Akira, "Semiconductor Laser Device Driving Circuit".

Patent Abstracts of Japan, vol. 013, No. 354, Aug. 8, 1989, Wada Akira, "Semiconductor Laser Driving Circuit".

*Primary Examiner*—Leon Scott, Jr.

[57] ABSTRACT

The present invention relates to a circuit for driving a solid state optical emitter device such as a laser diode, and in particular a circuit which limits the maximum current which may be drawn through the device. The circuit comprises a current supply path and a current return path to which the optical emitter may be connected, and a current limit device to limit a maximum current that may flow through one of the current paths. The current limit device has a current mirror with an input portion and an output portion, the circuit being arranged so that when a first current flows through the input portion, the second portion is predisposed to supply a second current up to a maximum which mirrors the first current. The maximum current through the paths is thereby limited in accordance with the maximum of the second current.

14 Claims, 1 Drawing Sheet

DRIVER CIRCUIT FOR A SOLID STATE OPTICAL EMITTER DEVICE

The present invention relates to a circuit for driving a solid state optical emitter device such as a laser diode, and in particular a circuit which limits the maximum current which may be drawn through the device.

Laser diodes are used in many devices, such as in optical data storage read/write heads, fibre optic transmitters or hand-held pointers. It is usually the case that the permissible maximum power output by the laser diode must be limited, either for eye-safety or so that the device will work correctly. The actual current limit will depend on the type of laser diode and the application in which it is used, but in most cases the current limit will be of the order of about 100 mA.

One way of monitoring the current sourced by the laser diode is by measuring a voltage generated across a resistor in series with the laser diode. This approach suffers from several disadvantages. One is that power is wasted through the resistor, which can be a concern with battery powered devices. Another is that the voltage drop across the resistor necessitates a higher supply voltage, and in some applications it is desired that the supply voltage should be as low as possible. A resistor voltage is then monitored by a circuit, and often this circuit may be connected to a separate circuit to check that the monitor circuit is working properly. This adds cost and complexity to the monitoring circuit.

According to the invention, there is provided a driver circuit for a solid state optical emitter, the circuit comprising a current supply path and a current return path to which the optical emitter may be connected, and current limit means to limit a maximum current that may flow through one of the current paths, characterised in that the current limit means has a current mirror with an input portion and an output portion, in which the circuit is arranged so that when a first current flows through the input portion the second portion is predisposed to supply a second current up to a maximum which mirrors the first current, the maximum current through the paths being limited in accordance with the maximum of the second current.

The optical emitter device may be a laser diode, a light emitting diode, or other such solid state device operating, for example, in the infrared or visible parts of the spectrum.

In most cases the return path leads to a ground, and the supply path come from a positive supply voltage. The greatest risk of supplying too much current to the optical emitter will normally come from a short circuit. For example, in the case of a laser diode, this will normally be the risk of a short circuit between the laser diode cathode and ground. Therefore, it is usually preferred if the current limit means is provided in the supply path.

The output portion of the current mirror may be in series with the optical emitter device, in which case the current through the device, and hence the current through the supply and return paths, will be directly limited to a maximum corresponding to the maximum current that may be supplied by the output portion of the current mirror. In this case, the current through the paths is limited to a maximum which mirrors the first current.

Alternatively, the maximum current through the paths may be limited indirectly by the current through the output portion of the current mirror. For example, the current from the output portion may be fed to a gating means such as an amplifier circuit or the base of a transistor which may have a higher current rating, than the current mirror. Such a transistor is then gated up to a maximum current by the current through the output portion of the current mirror. In this case, the current through the paths is limited to a maximum which is a simple multiple, divisor or other function of the first current.

Because transistors typically have a large variation in gain between production batches, but nearly identical gain within the same batch or on the same chip, the circuit preferably comprises signal generation means such as feedback means to compensate for gain variability of the gating transistor.

Often, the laser will need to work over a range of operating conditions and may be pulsed at a varying duty cycle. The circuit may therefore comprise signal generation means to compensate for temperature variability of the laser diode optical power versus temperature characteristic.

In a preferred embodiment of the invention, the first current through the input portion of the current mirror passes through at least one transistor which is gated by the signal generation means.

It will generally be the case that the current return path has laser diode bias control means to set a bias current through the laser diode. When the laser is to operated in a pulsed mode, the current return path may have a laser diode modulation means to modulate the current through the laser diode.

Also according to the invention, there is provided a method of driving a solid state optical emitter with a circuit comprising a current supply path and a current return path to which optical emitter may be connected, and current limit means to limit a maximum current that may flow through one of the current paths, characterised in that the current limit means has a current mirror, comprising the steps of:

i) generating a first current in an input portion of the current mirror;

ii) predisposing an output portion of the current mirror to supply a second current up to a maximum which mirrors the first current; and iii) using the maximum second current to limit the maximum current through the paths.

Figure 2:
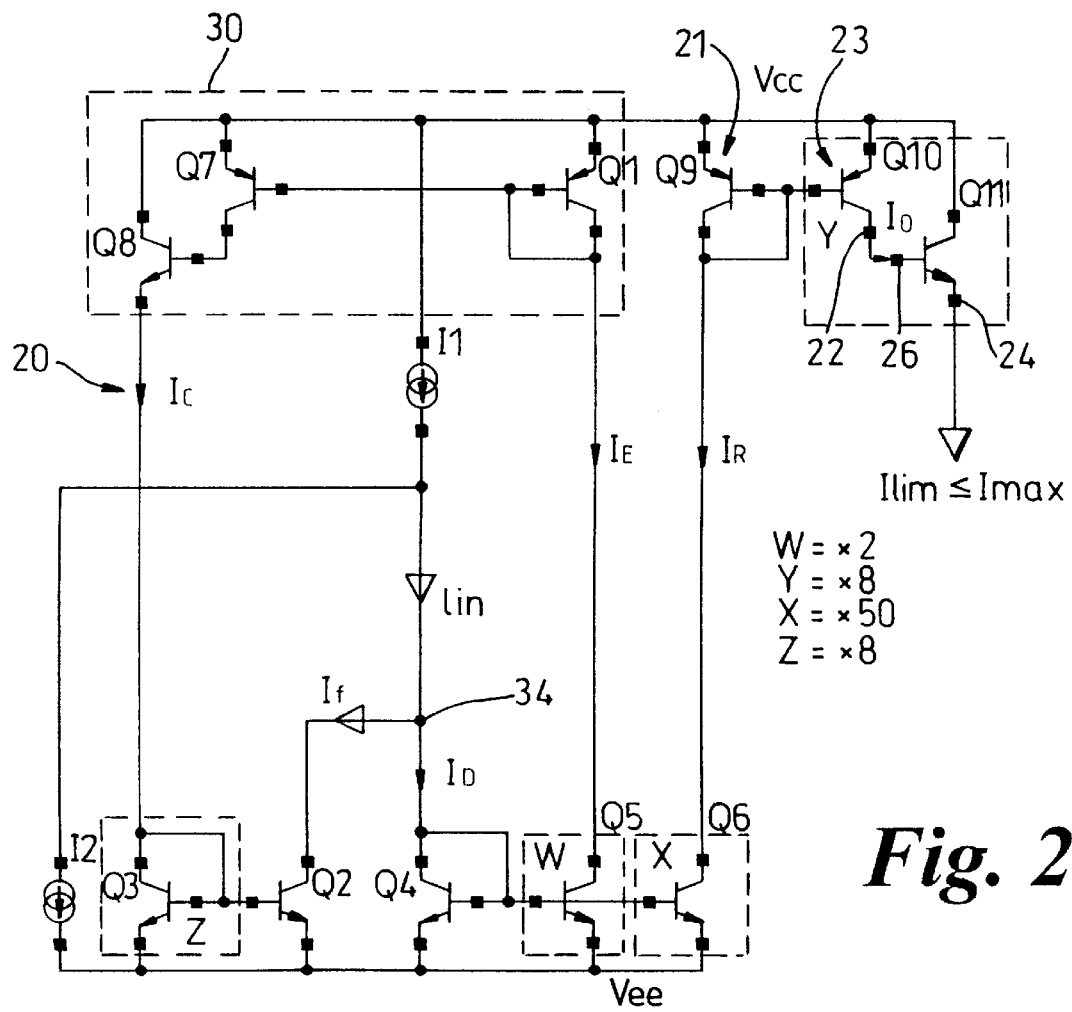

The invention will now be described by way of example, with reference to the accompanying drawings, in which:

FIG. 1 shows a conventional arrangement for driving a laser diode, with laser bias and modulation control and a current limitation circuit; and FIG. 2 shows a current limitation circuit according to the invention, for use as part of a laser diode driver circuit.

In FIG. 1, a conventional laser diode driver circuit 1 has power supply lines Vcc at +5 Volts and Vee at 0 Volts. A connection 2 is made from Vcc to a conventional current monitor circuit 4 having, for example, a low value resistor (not shown) for generating a voltage representative of a current Ilim supplied from line Vcc. The current Ilim flows from the current monitor circuit 4 through another connection 6 into the anode of a laser diode 8. From the laser diode cathode, Ilim is split by connection 10 through two parallel npn transistors $Q_M$, $Q_B$ as Ilim flows through connections 12 to Vee. $Q_B$ is driven to bias the laser diode to the base of its operating point, and $Q_M$ is then driven according to the desired modulation of the laser diode.

Therefore, the circuit elements 2,4,6 define a current supply path to the laser diode anode, and the circuit elements 10, $Q_B$, $Q_M$, 12 define a current return path from the laser diode cathode.

Depending on the bias and modulation drive, Ilim may take any value from 0 to Imax mA, where the circuit is designed so that in normal operation of $Q_B$ and $Q_M$, Imax is within a tolerable limit, defined for example by the need for eye safety, or by the maximum rated output of the laser diode 6.

If a fault develops in $Q_B$, or $Q_M$, or if a short circuit is formed from the laser diode 8 cathode to Vee, then the current through the laser diode could exceed Imax. Consequently, it is usual practice to include the current limitation circuit 4 which includes feedback circuitry to limit Ilim to the maximum value Imax.

When the laser 8 is to be operated in a pulsed mode, for example at up to a 50% duty cycle, then the current limitation circuit is normally designed to limit an expected mean Ilim. In some applications, for example fibre optic transmission or optical data storage, the expected current limit will be approximately 100 mA. Particularly in fibre optic transmission, there is a need for high frequency operation, for example of the order to up to 2 GHz with commercially available devices. These current and frequency requirements place constraints on the type of current limitation circuitry which can be employed.

In order to guard against a fault in the current monitor circuit 4, a separate monitoring circuit (not shown) is sometimes used to monitor the performance of the current monitor circuit 4, adding cost and complexity to the laser diode driver circuit 1.

FIG. 2 illustrates a current limitation circuit 20 according to the invention, which may be used in place of the conventional current limitation circuit 4 of FIG. 1. The circuit 20 is an integrated bipolar device with a current mirror consisting of two pnp transistors Q9,Q10. In comparison with equivalent npn transistors, pnp transistors are, of course, noted for lower current rating and lower frequency response. Although discrete components have higher ratings, a typical pnp integrated bipolar pnp transistor is limited to supplying about 200 $\mu$A, with a maximum frequency response conventionally believed to be approximately 400 MHz. A generally useful laser diode current limitation circuit normally needs current and frequency response in excess of these limits.

The pnp transistor Q9 and eight parallel pnp transistors Q10 are, respectively, in an input portion 21 and an output portion 23 of the current mirror. A reference current $I_R$ of the order of about 200 $\mu$A is sunk from the input portion transistor Q9 through two parallel gating transistors Q6. Each transistor Q10 in the output portion 23 is therefore predisposed to supply the same current 200 $\mu$A as an output current $I_O$, to the base of an npn transistor Q11, which acts here as a gating transistor. Assuming a typical gain $\beta$ of about 50 for such an npn transistor, the maximum total current Imax that can be supplied by the eight transistors Q11 to a laser diode is about 80 mA. If greater current is needed, then the number of transistors Q10,Q11 in parallel may be increased. Such an increase in the number of components is readily achievable in an integrated bipolar device. In fact, the number of pnp output portion transistors Q10 in an integrated device could readily be increased to the point where the total output portion current was sufficient to supply the laser diode directly. In this case, it is possible to dispense with the npn transistor Q11. It has been found in practice that in this circuit, the frequency response of the integrated pnp output transistors does not in fact limit operation to 400 MHz, as operation up to 2.5 GHz is possible. It is believed that this is due to capacitative coupling from the pnp collector to the emitter permitting current to flow. If needed, frequency response above about 2.5 GHz may be extended, for example up to about 25 GHz, by placing a coupling capacitor in parallel with the transistors Q11, between Vcc and pnp collector node 22. However, as explained below, it is preferred to use the npn transistor Q11.

If the bias and modulation for the laser diode is such that less current Ilim is pulled through the bias and modulation transistors, then the voltage at the emitter 24 of transistors Q11 will rise above that present at the base 26, until the base-emitter current $I_O$ drops to a level consistent with the current pulled through the laser diode. The relatively small base-emitter current in transistors Q11 is added to the main collector-emitter current. At the same time, the voltage at the collector 22 of pnp transistor Q10 rises above that of the base until the current $I_O$, supplied by pnp transistor Q10 is limited to that delivered to npn transistor Q11.

In both cases, with and without the npn transistor Q11, the arrangement is therefore such that there is a defined relationship between the input portion current and the output portion current. The output portion 23 is predisposed to supply a current up to a maximum which mirrors the current through the current mirror input portion 21, the laser current being limited to a maximum value according to the defined relationship with the current mirror input portion current.

The frequency response of the npn transistors approaches 25 GHz ($F_T$=1), which is adequate for many uses of laser diodes. The frequency response of the pnp output portion transistor Q10, is of course lower than this level, but the base current into Q11 is essentially unaffected by such high frequencies, and will be limited when the average voltage at the npn emitter 24, and hence the voltage at the pnp collector 22 start to rise.

The other parts of the current limitation circuit 20 provide feedback useful in a commercial device. Portion 30 is duplicates the elements Q9,Q10,Q11 to compensate for the gain $\beta$ of npn transistor Q11, which may vary between different production batches of integrated circuit. A current $I_C$, corresponding to Imax is fed into the input portion of an npn current mirror consisting of 8 parallel transistors Q3, thereby controlling an output current $I_f$.

The current vs optical output characteristic of a laser diode is dependent on the temperature of the laser diode device, and this in turn is dependent on the ambient temperature. As ambient temperature increases, the optical output for a given drive current can increase or decrease, depending on the type of optical emitter device and temperature range. To achieve a broad band of ambient operating temperatures, it is therefore useful to compensate for this effect with an appropriate compensation signal from signal generation means to stabilize the optical output of the laser diode. In circuit 20, this temperature compensation is achieved using a well-known technique, in which the current I2 from one current source is subtracted from a current I1 from another current source to yield a resultant current Iin. The characteristics of the current sources I1,I2 can be chosen to provide the necessary temperature compensation characteristic in Iin.

The gain compensation current If is then subtracted from a current Iin at node 34 to yield a temperature and gain compensated current $I_D$, which is input into an npn current mirror consisting of an input portion transistor Q4 and two output portion transistors Q5 and a further 50 output portion transistors Q6. The output portion transistors Q5 acts as a gating transistor to sink the control current $I_E$ from the input portion of compensating portion 30, and the output transistors Q6 act as gating transistors to sink the reference current $I_R$ from the pnp current mirror input portion transistor Q9.

The behaviour of the circuit is therefore governed by the following equations:

$$\text{Ilim} = (\text{Iin} - \text{If}) * X * Y * \beta \qquad 1$$

$$\text{If} = (\text{Iin} - \text{If}) * (W * \beta / Z) \qquad 2$$

Therefore, from equation 2:

$$If = (Iin*W*\beta)/(Z+W*\beta)$$

Substituting If into equation 1 gives:

$$Ilim = Iin*(X*Y*Z)/((Z/\beta)+W)$$

If $Z/\beta << W$ then the $Z/\beta$ term can be ignored.

$$Gain = Ilim/Iin = X*Y*Z/W$$

For $X = 50$, $Y = 8$, $Z = 8$ and $W = 2$, the gain would be 1600.

The circuit as described above may be used in a variety of applications, for example with an optical fibre transmission device comprising a laser diode and a laser diode driver circuit arranged to bias and modulate the laser diode. Other applications where the circuit may be useful include optical data storage read-write heads, laser pointer devices, and surveying equipment.

The circuit is particularly suited to integration using bipolar technology, but may be adapted to other types of integration, for example an integrated circuit comprising both biCMOS and bipolar transistors. In this latter case, the pnp current mirror could be replaced with a p-channel MOSFET current mirror. An advantage of p-channel MOSFETS would be a higher operating frequency, would may allow such a circuit to be used without the need for the current mirror to drive an npn transistor, so allowing the circuit to be somewhat simplified.

Although the invention has been described in detail as having the current limitation circuit in the current supply path, the invention is not so limited, and a current limitation circuit could equivalently be placed in the current return path leading from the laser diode cathode. In this case, the current mirror would be an npn current mirror, which would have the advantage of an inherently greater frequency response. Such an arrangement may be desirable if the packaging of the laser diode were such that there was a greater risk of a short circuit from the laser diode anode to Vcc, rather than from the laser diode cathode to Vee.

We claim:

1. A driver circuit for a solid state optical emitter, the circuit comprising a current supply path and a current return path to which the optical emitter is connected, and current limit means to limit a maximum current that flows through one of the current paths, characterised in that the current limit means has a current mirror circuit comprising at least a first transistor and a second transistor, said first transistor comprising an input portion of the current mirror circuit and said second transistor comprising an output portion of the current mirror circuit, said first transistor and second transistor connected so that when a first current flows through the input portion, the second portion is predisposed to supply a second current up to a maximum which tracks the first current, such that the maximum current through the current paths is limited to be no greater than the maximum of the second current.

2. A driver circuit as claimed in claim 1, in which the current limit means is provided in the supply path.

3. A driver circuit as claimed in claim 1, in which the first transistor and second transistor in said current mirror circuit are pnp transistors.

4. A driver circuit as claimed in claim 1, in which the maximum current through the current paths is limited directly by the maximum current through the output portion of the current mirror circuit.

5. A driver circuit as claimed in claim 1, in which the maximum current through the current paths is limited indirectly by the maximum current through the output portion of the current mirror.

6. A driver circuit as claimed in claim 5, in which current through the current paths passes through gating means which is gated by the current through the output portion of the current mirror circuit.

7. A driver circuit as claimed in claim 6, in which the gating means is a transistor.

8. A driver circuit as claimed in claim 6, in which the circuit comprises signal generation means to compensate for gain variability of the gating means.

9. A driver circuit as claimed in claim 1, further comprising:

signal generation means to compensate for temperature variability of the optical emitter optical power versus temperature characteristic.

10. A driver circuit as claimed in claim 8, in which a first current through the input portion of the current mirror circuit passes through at least one transistor which is gated by the signal generation means.

11. A driver circuit as claimed in claim 1, in which the current return path has bias control means to set a bias current through the optical emitter.

12. A driver circuit as claimed in claim 1, in which the current return path has modulation means to modulate the current through the optical emitter.

13. An optical fibre transmission device comprising a laser diode and a driver circuit arranged to drive the laser diode, in which the driver circuit is as claimed in claim 1.

14. A method of driving a solid state optical emitter with a circuit comprising a current supply path and a current return path to which the optical emitter is connected, and current limit means to limit a maximum current that may flow through one of the current paths, characterised in that the current limit means has a current mirror circuit comprising at least a first transistor and a second transistor, said first transistor comprising an input portion of the current mirror circuit and said second transistor comprising an output portion of the current mirror circuit, comprising the steps of:

i) generating a first current in the first transistor of the current mirror circuit;

ii) predisposing said second transistor of the current mirror circuit to supply a second current up to a maximum which mirrors the first current; and iii) using the maximum second current to limit the maximum current through the current paths.

* * * * *